US009141474B2

(12) United States Patent
Yaakobi et al.

(10) Patent No.: US 9,141,474 B2
(45) Date of Patent: Sep. 22, 2015

(54) EFFICIENT TWO WRITE WOM CODES, CODING METHODS AND DEVICES

(75) Inventors: Eitan Yaakobi, La Jolla, CA (US); Paul Siegel, La Jolla, CA (US); Alexander Vardy, Escondido, CA (US); Jack Wolf, La Jolla, CA (US); Toby Wolf, legal representative, La Jolla, CA (US); Scott Kayser, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 193 days.

(21) Appl. No.: 13/702,474

(22) PCT Filed: Jun. 10, 2011

(86) PCT No.: PCT/US2011/040036
§ 371 (c)(1),
(2), (4) Date: Dec. 6, 2012

(87) PCT Pub. No.: WO2011/156750
PCT Pub. Date: Dec. 15, 2011

(65) Prior Publication Data
US 2013/0080681 A1    Mar. 28, 2013

Related U.S. Application Data

(60) Provisional application No. 61/353,419, filed on Jun. 10, 2010.

(51) Int. Cl.
*G06F 12/00* (2006.01)
*G06F 11/10* (2006.01)
(Continued)

(52) U.S. Cl.
CPC ......... *G06F 11/1048* (2013.01); *H03M 13/136* (2013.01); *H03M 13/19* (2013.01); *G06F 12/0638* (2013.01)

(58) Field of Classification Search
None
See application file for complete search history.

(56) References Cited

U.S. PATENT DOCUMENTS

2004/0034828 A1    2/2004  Hocevar
2005/0149840 A1    7/2005  Lee et al.
(Continued)

OTHER PUBLICATIONS

Cohen, "Covering Radius and Writing on Memories", © 2005, p. 1-10.*

(Continued)

*Primary Examiner* — Brian Peugh
(74) *Attorney, Agent, or Firm* — Greer, Burns & Crain, Ltd.

(57) ABSTRACT

The invention provides a family of 2-write WOM-codes, preferred embodiments of which provide improved WOM-rates. Embodiments of the invention provide constructs for linear codes C having a 2-write WOM-code. Embodiments of the invention provide 2-write WOM-codes that improve the best known WOM-rates known to the present inventors at the time of filing with two writes. Preferred WOM-codes are proved to be capacity achieving when the parity check matrix of the linear code C is chosen uniformly at random. Preferred embodiments of the invention provide an electronic device utilizing an efficient coding scheme of WOM-codes with two write capability. The coding method is based on linear binary codes and allows the electronic device to write information to the memory twice before erasing it. This method can be applied for any kind of memory systems, and in particular for flash memories. The method is shown to outperform all well-known codes.

11 Claims, 4 Drawing Sheets

(PROPOSED CORRECTION)

(51) Int. Cl.
*H03M 13/13* (2006.01)
*H03M 13/19* (2006.01)
*G06F 12/06* (2006.01)

(56) References Cited

U.S. PATENT DOCUMENTS

2009/0158112 A1  6/2009  Oh et al.
2009/0187811 A1  7/2009  Eroz et al.

OTHER PUBLICATIONS

Merkx, "Womcodes constructed with projective geometries", © 2005, p. 1-5.*
Fu et al., "On the Capacity and Error-Correcting Codes of Write-Efficient Memories", *IEEE Transactions on Information Theory*, vol. 46, No. 7, Nov. 2000.
Zémor, Gilles, et. al., Error-Correcting WOM-Codes *IEEE Transactions on Information Theory*, vol. 37, No. 3, May 1991.
Wu, Yunnan, "Low Complexity Codes for Writing a Write-Once Memory Twice", Proc. IEEE International Symposium on Information Theory, Austin, Texas, (Jun. 2010), pp. 1928-1932.

* cited by examiner (PROPOSED CORRECTION)

EFFICIENT TWO WRITE WOM CODES, CODING METHODS AND DEVICES

PRIORITY CLAIM AND REFERENCE TO RELATED APPLICATION

The application claims priority under 35 U.S.C. §119 and all applicable treaties and statutes from prior provisional application Ser. No. 61/353,419, which was filed Jun. 10, 2010, and is incorporated by reference herein.

FIELD

A field of the invention is data coding and compression. Embodiments of the invention provide WOM (Write Once Memory) coding methods and devices.

BACKGROUND

A Write Once Memory (WOM) is a storage medium with binary memory elements, called cells, that can change from the zero state to the one state only once, except, in some types of memory, upon a block erase. WOM-codes were originally designed for memories that consist of binary memory elements that could physically only be changed from a zero state to a one state. Examples of such memories are punch cards and optical disks. More recently, WOM-codes have been designed for general usage in different types of memories, including flash memories. See, e.g., A. Jiang, "On the Generalization of Error-Correcting WOM-codes," in Proc. IEEE Int. Symp. Inform. Theory, pp. 1391-1395, Nice, France (2007); A. Jiang and J. Bruck, "Joint coding for flash memory storage," in Proc. IEEE Int. Symp. Inform. Theory, pp. 1741-1745, Toronto, Canada, (July 2008); H. Mandavifar, P. H. Siegel, A. Vardy, J. K. Wolf, and E. Yaakobi, "A Nearly Optimal Construction of Flash Codes," in Proc. IEEE Int. Symp. Inform. Theory. pp. 1239-1243, Seoul, Korea, (July 2009).

A WOM-code allows the reuse of a write-once medium by introducing redundancy into the recorded bit sequence and, in subsequent write operations, observing the state of the medium before determining how to update the contents of the memory with a new bit sequence.

A simple example enables the recording of two bits of information in 3 memory elements, twice. The encoding and decoding rules for this WOM-code are described in a tabular form in the table below. It is easy to verify that after the first 2-bit data vector is encoded into a 3-bit codeword, if the second 2-bit data vector is different from the first, the 3-bit codeword into which it is encoded does not change any code bit 1 into a code bit 0, ensuring that it can be recorded in the write-once medium.

| Data Bits | First Write | Second Write |
| --- | --- | --- |
| 00 | 000 | 111 |
| 10 | 100 | 011 |
| 01 | 010 | 101 |
| 11 | 001 | 110 |

The sum-rate of the WOM-code is the sum of all the individual rates for each write. While there are different ways to analyze the efficiency of WOM-codes, we find that the appropriate figure of merit is to analyze the sum-rate under the assumption of a fixed number of writes. In general, the more writes the WOM-code can support, the better the sum-rate it can achieve. The goal is to give upper and lower bounds on the sum-rates of WOM-codes while fixing the number of writes t to a desired number.

SUMMARY OF THE INVENTION

An embodiment of the invention provides a family of 2-write WOM-codes, preferred embodiments of which provide improved WOM-rates. Embodiments of the invention provide constructs for linear codes C having a 2-write WOM-code. Embodiments of the invention provide 2-write WOM-codes that improve the best known WOM-rates known to the present inventors at the time of filing with two writes. Preferred WOM-codes are proved to be capacity achieving when the parity check matrix of the linear code C is chosen uniformly at random.

Preferred embodiments of the invention provide an electronic device utilizing an efficient coding scheme of WOM-codes with two write capability. The coding method is based on linear binary codes and allows the electronic device to write information to the memory twice before erasing it. This method can be applied for any kind of memory systems, and in particular for flash memories. The method is shown to outperform all well-known codes.

DETAILED DESCRIPTION OF THE PREFERRED EMBODIMENTS

Figure 1:
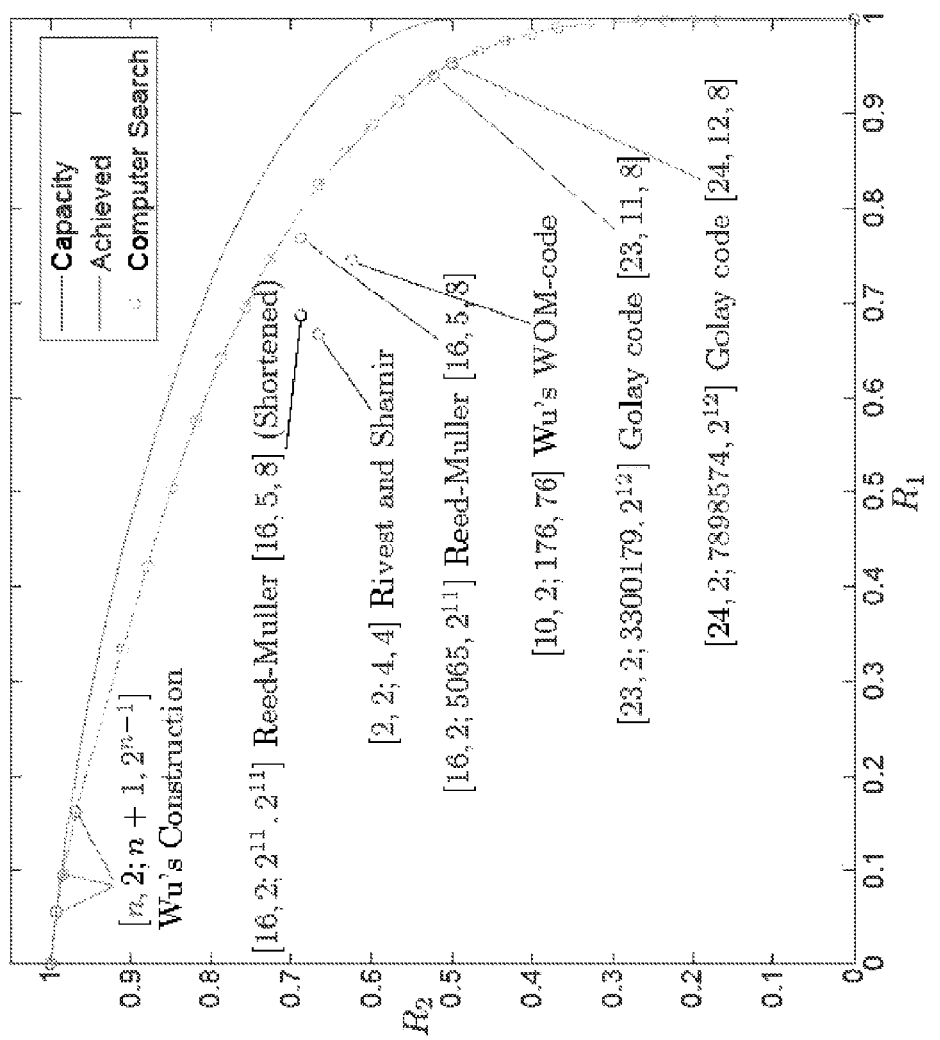
FIG. 1 plots computer search determined rates and theoretical capacity for prior WOM-codes.

The invention addresses two problems related to 2-write WOM-codes 1) The number of messages written to the memory on each write is the same; 2) Different number of messages can be written on each write. For the case of 2-write WOM-codes, the theoretical bound on the WOM-rate for the first problem is approximately 1.5458 and in the second problem it is approximately 1.58. Since the best known WOM-rate for the first problem is approximately 1.34 and 1.37 for the second problem, there is still room for improvement in closing these gaps. The invention provides a family of 2-write WOM-codes, preferred embodiments of which provide improved WOM-rates. Embodiments of the invention provide constructs for linear codes C having a 2-write WOM-code. Embodiments of the invention provide 2-write WOM-codes that improve the best known WOM-rates known to the present inventors at the time of filing with two writes. Preferred WOM-codes are proved to be capacity achieving when the parity check matrix of the linear code C is chosen uniformly at random.

Preferred embodiments of the invention provide an electronic device utilizing an efficient coding scheme of WOM-codes with two write capability. The coding method is based on linear binary codes and allows the electronic device to write information to the memory twice before erasing it. This method can be applied for any kind of memory systems, and in particular for flash memories. The method is shown to outperform all well-known codes.

Preferred embodiments of the invention are applicable to memories having cells that can change their state from zero to one but not from one to zero except upon an erase of the entire memory. Preferred embodiments of the invention are t-write WOM-codes that conform to Thoerem 1 in the description below.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Two-Write WOM-Codes

Preferred embodiment methods and devices use a two-write WOM-codes construction that reduces the gap between the upper and lower bound on the sum-rates for both fixed- and unrestricted-rate WOM-codes. In Reference [28], a "coset-coding" is used only on the second write in order to generate an ∈-error two-write WOM-codes. However, in ∈-error two-write WOM-codes, the second write is not guaranteed in the worst case but is allowed with high probability. Methods and codes of the invention guarantee from every linear code a two-write WOM-code. A "coset-coding" scheme only on the second write is used as in Reference [28], but the first write is modified such that the second write is guaranteed in the worst case. Preferred specific embodiment WOM-codes have better sum-rates than the previously best known codes discussed above. Preferred embodiment WOM-codes choose uniformly at random the parity-check matrix of the linear code, such that there exist WOM-codes that achieve all points in the capacity region of two-write WOM-codes. An example application of a preferred method generate from each two-write WOM-code a code for the Blackwell channel.

A. Two-Write WOM-Codes Construction

Let $C[n,k]$ be a linear code with parity-check matrix $\mathcal{R}$. For each $v \in \{0,1\}^n$ we define the matrix $\mathcal{R}_v$ as follows. The i-th column of $\mathcal{R}_v$, $1 \leq i \leq n$, is the i-th column of $\mathcal{R}$ if $v_i = 0$ and otherwise it is the zeros column. The set Vc is defined to be $$Vc = \{v \in \{0,1\}^n | \text{rank}(\mathcal{R}_v) = n-k\}. \quad (1)$$

We first note the following position. If a vector v belongs to Vc, its weight is at most k.

The support of a binary vector v, denoted by supp(v), is the set $\{i/v_i = 1\}$. The dual of the code C is denoted by $C\perp$. The next lemma is a variation of a well known result (see e.g. Reference [5]).

Lemma 1. Let $C[n, k]$ be a linear code with parity-check matrix $\mathcal{R}$. For each vector $v \in \{0, 1\}^n$, $\text{rank}(\mathcal{R}_v) = n-k$ if and only if v does not cover any non-zero codeword in $C\perp$.

Lemma 1 implies that if two matrices are parity-check matrices of the same linear code C, then their corresponding sets Vc are identical, and so we can define the set Vc to be $Vc = \{v \in \{0, 1\}^n | v \text{ does not cover any non-zero } c \in C\perp\}$.

The next theorem presents the preferred embodiment two-write WOM-codes,

Theorem 1.

Let $C[n,k]$ be a linear code with parity-check matrix $\mathcal{R}$ and let Vc be the set defined in (1). Then there exists an $[n,2; |Vc|, 2^{n-k}]$ two-write WOM-code of sum-rate $$\frac{\log_2 |V_c| + (n-k)}{n}$$

The two-write WOM-code can be proven by showing the existence of the encoding and decoding maps on the first and second writes. First, let $\{v_1, v_2, \ldots v, |v_c|\}$ be an ordering of the set Vc. The first and the second writes are implemented as follows.

1) On the first write, a symbol over an alphabet of size $|V_c|$ is written. The encoding and decoding maps $E_1$, $D_1$ are defined as follows. For each $m \in \{1, \ldots, |V_c|\}$, $E_1(m) = v_m$ and $D_1(v_m) = m$.

2) On the second write, we write a vector $s_2$ of n-k bits. Let $v_1$ be the programmed vector on the first write and $s_1 = \mathcal{R}_{v1}$, then $$E_2(s_2, v_1) = v_1 + v_2,$$

where $v_2$ is a solution of the equation $\mathcal{R}_{v1} \cdot v_2 = s_1 + s_2$. For the decoding map $D_2$, if c is the vector of programmed cells, then the decoded value of the n-k bits is given by $D_2(c) = \mathcal{R} \cdot c = \mathcal{R} \cdot v_1 + \mathcal{R} \cdot v_2 = s_1 + s_1 + s_2 = s_2$.

The success of the second write results from the condition that for every vector $v \in V_c$, $\text{rank}(\mathcal{R}_v) = n-k$.

There is no condition on the code C and therefore we can use any linear code in this construction, though we seek to find codes that maximize the sum-rate $$\frac{\log_2 |V_c| + (n-k)}{n}.$$

Next, we show two examples of two-write WOM-codes that achieve better sum-rates than the previously best known ones.

Example 1

This example demonstrates how Theorem 1 works for the [16,5,8] first order Reed-Muller code and demonstrates a rate of 1.4566. Its dual code is the [16,11,4] second order Reed-Muller, which is the extended Hamming code of length 16. Hence, we are interested in the size of the set $V_i = \{v \in \{0,1\}^{16} | v \text{ does not cover any } c \in [16,11,4]\}$.

According to Equation (1), the set $V_1$ does not contain vectors of weight greater than five. This extended Hamming code has 140 codewords of weight four and no codewords of weight five. The set $V_1$ consists of the following vector sets.

1) All vectors of weight at most three. There are $\Sigma_{i=0}^{3} \binom{16}{i} = 697$ such vectors.

2) All vectors of weight four that are not codewords. There are $\binom{16}{4} - 140 = 1680$ such vectors.

3) All vectors of weight five that do not cover a codeword of weight four. There are $\binom{16}{5} - 12 \cdot 140 = 2688$ such vectors. Since the minimum distance of the code is four, a vector of weight five can cover at most one codeword of weight four.

Therefore, we get $|V_i| = 697 + 1680 + 2688 = 5065$ and the sum-rate is $(\log_2(5065) + 11)/16 = 1.4566$.

It is possible to modify this WOM-code such that on the first write only 11 bits are written. Thus, we achieve a two-write fixed-rate WOM-code and its sum-rate is $22/16 = 1.375$, which is the best known fixed-rate WOM-code.

Example 2

In this example we will use the [23,11,8] Golay code. Its dual code is the [23,12,7] Golay code so we are interested in the size of the set $V_2 = \{v \in \{0, 1\}^{23} | v \text{ does not cover any } c \in [23, 12,7]\}$.

According to Equation (1), there are no vectors of weight greater than 11 in the set $V_2$. The invention achieves a rate of 1.4632. The [23,12,7] Golay code has $A_7 = 253$ codewords of weight seven, $A_7=506$ codewords of weight eight, and $A_{11}=1288$ codewords of weight 11. The set $V_2$ consists of the following vector sets.

1) All vectors of weight at most 6. This number of vectors is $\sum_{i=0}^{6} \binom{23}{i} = 145499$.

2) All vectors of weight between 7 and 10 besides those that cover a codeword of weight 7 or 8. Since the minimum distance of the code is 7 every vector can cover at most one codeword. Hence, this number of vectors is $$\sum_{i=7}^{10} \binom{23}{i} - A_7 \cdot \sum_{i=7}^{10} \binom{16}{i-7} - A_8 \cdot \sum_{i=8}^{10} \binom{15}{i-8} = 2459160.$$

3) All vectors of weight 11 that are not codewords and do not cover a codeword of weight either 7 or 8. This number was shown in [6] to be 695520.

Therefore, for the [23,11,8] Golay code we get $|v_2|=145499+2459160+695520=3300179$, and thus the sum-rate is $(\log_2(3300179)+12)/23=1.4632.$ B. Random Coding The preferred coding and coding methods consistent with FIG. 1 can be shown to work for any linear code C. Given a linear code C[n,k] with parity-check matrix $H_c$, we denote $$\mathcal{R}_1(C) = \frac{\log_2 |V_C|}{n}, \mathcal{R}_2(C) = \frac{n-k}{n}$$

so the sum-rate of the generated WOM-codes is $$\mathcal{R}_1(C) + \mathcal{R}_2(C) = \frac{\log_2 |V_C| + n - k}{n}.$$

Our goal in this subsection is to show that it is possible to achieve the capacity region $C_2$ of a t-write WOM-code by choosing uniformly at random the parity-check matrix of the linear code C. We prove that in the following theorem.

Theorem 2.

For any $(R_1, R_2) \in C_2$ and $\epsilon > 0$ there exists a linear code C satisfying $R_1(C) \geq R_1 - \epsilon$, $R_2(C) \geq R_2 - \epsilon$.

Proof: Let $p \in [0, 0.5]$ be such that $R_1 \leq h(p)$ and $R_2 \leq 1-p$. Let $k = \lceil np \rceil$ for n large enough and let us choose uniformly at random an $(n-k) \times n$ matrix H. The matrix twill be the parity-check matrix of the linear code C that will be used to construct the two-write WOM-code. For each vector $v \in \{0, 1\}^n$, let us define the indicator random variable $X_v(\mathcal{R})$ on the space of all matrices as follows $$X_v(H) = \begin{cases} 1 & \text{if } v \in V_C \\ 0 & \text{otherwise} \end{cases}$$

where Vc is the set defined in Equation (1). Note that choosing the matrix $\mathcal{R}$ uniformly at random induces a probability distribution on the set Vc and thus a probability distribution on the random variable $X_v(\mathcal{R})$. Then the number of vectors in Vc is $X(\mathcal{R}) = \Sigma_{v \in \{0,1\}^n} X_v(\mathcal{R})$, and $$E[X(H)] \sum_{v \in \{0,1\}^n} E[X_v(H)] \sum_{v \in \{0,1\}^n} Pr\{X_v(H) = 1\}. \quad (2)$$

We maintain that $Pr\{X_v(H)=1\}$ depends on v only through its weight, wt (v). In this case, (2) simplifies to $$E[X(H)] = \sum_{i=0}^{n} \binom{n}{i} Pr\{X_{v:wt(v)=i}(H) = 1\}$$

$$= \sum_{i=0}^{k} \binom{n}{i} Pr\{X_{v:wt(v)=i}(H) = 1\},$$

because if $wt(v) \geq k-1$ then $X_v = 0$ (Equation (1)).

Now, let us determine the value of $Pr\{X_v(H)=1\}$ for a vector v of weight $0 \leq i \leq k$. Note that $v \in V_c$ if and only if the sub-matrix of size $(n-k) \times (n-wt(v))$ induced by the zero entries of the vector v is full rank. It is well known, that if we choose an $m \times n$ matrix, where $m \leq n$, uniformly at random then the probability that it is full rank is $\Pi_{i=n-m+1}^{n}(1-2^{-i})$. Therefore, if we choose an $(n-k) \times (n-i)$ matrix uniformly at random then the probability that it is full rank is $\Pi_{i=k-i+1}^{n-i}(1-2^{-i})$. Note that $$\prod_{j=k-i+1}^{n-i} (1-2^{-j}) > \prod_{j=1}^{\infty} (1-2^{-j}) > \left(1-\frac{1}{2}\right)\left(1-\sum_{j=2}^{\infty} 2^{-j}\right) = \frac{1}{2} \cdot \frac{1}{2} = \frac{1}{4},$$

and hence, $Pr\{X_v(H)=1\} = \Pi_{i=k-i+1}^{n-i}(1-2^{-i}) > 1/4$. According to Lemma 4.8 in Reference [24], $$\sum_{i=0}^{k} \binom{n}{i} \geq \frac{1}{n+1} 2^{nh\left(\frac{k}{n}\right)}$$

and, therefore, we get $$E[X(H)] = \sum_{i=0}^{k} \binom{n}{i} \prod_{j=k-i+1}^{n-i} (1-2^{-j}) > 2^{nh\left(\frac{k}{n}\right)-2-\log_2(n+1)}.$$

It follows that there exists a parity-check matrix $\mathcal{R}$ of a linear code C, such that the size of the set Vc is at least $$2^{nh\left(\frac{k}{n}\right)-2-\log_2(n+1)}$$

and $$\mathcal{R}_1(C) \geq h\left(\frac{k}{n}\right) - \frac{2+\log_2(n+1)}{n} \geq h(p) - \frac{2+\log_2(n+1)}{n} \geq \mathcal{R}_1 - \varepsilon$$

$$\mathcal{R}_2(C) = \frac{n-k}{n} \geq (1-p) - \frac{1}{n} \geq \mathcal{R}_2 - \epsilon$$

for n large enough.

Random coding was proved to be capacity-achieving by constructing a partition code References [14], [9]. However, the present random coding method has more structure that enables to look for WOM-codes with a relatively small block length. We ran a computer search to look for such WOM-codes. The parity-check matrix of the linear code C was chosen uniformly at random and then the size of the set Vc was computed. The results are shown in FIG. 1. Note that if $(R_1, R_2)$ and $(R_3, R_4)$ are two achievable rate points then for each $t \in Q$ the point $(t\mathcal{R}_1 + (1-t)\mathcal{R}_2, t\mathcal{R}_3 + (1-t)\mathcal{R}_4)$ is an achievable rate point, too. This can simply be done by block sharing of a large number of blocks. Therefore, the achievable region is convex.

We ran a computer search to find more two-write WOM-codes with high sum-rates. For fixed-rate WOM-codes, our best construction achieved by a computer search has sum-rate $$\frac{48}{33} \approx 1.4546$$

and for unrestricted-rate WOM-codes our best computer search construction achieved sum-rate 1.4928. The number of cells in these two constructions is 33.

The encoding and decoding maps of the second write are implemented by the parity-check matrix of the linear code C as described in the proof of Theorem 1. A naive scheme to implement the encoding and decoding maps of the first write is simply by a lookup table of the set Vc. However, this can be done more efficiently using algorithms to encode and decode constant weight binary codes. There are several works which efficiently encode and decode all binary vectors of length n and weight k and can be used; see for example References [2], [7], [19], [25], [26]. These works can be easily extended to construct efficient encoder and decoder maps to the set of all binary vectors of length n and weight at most k, denoted by $$B(n,k) = \{v \in \{0,1\}^n | \mathrm{supp}(v) \leq k\}.$$

The set Vc is a subset of the set B(n, k). Therefore, we can use these algorithms while constructing a smaller table, only for the vectors in the set $B(n,k) \setminus V_c$ as follows. Assume that $f: \{1, \ldots, |B(n,k)|\} \to B(n,k)$ is a one-to-one and onto map such that the complexity to calculate $f$ and $f^{-1}$ is efficient. Assume we list all the vectors in $B(n,k) \setminus V_C$ such that we list for every vector $v \in B(n,k) \setminus V_C$ its value $f^{-1}(v)$ and this list is sorted according to the values of $f^{-1}(v)$. Then, a mapping $g: \{1, \ldots, |V_C|\} \to V_C$ is constructed such that for all $x \in \{1, \ldots |V_C|\}$, $g(x) = f(x + a(x))$, where $a(x)$ is the number of vectors in $B(n,k) \setminus V_C$ of value less than x. The time complexity to calculate $a(x)$ is $a(x)$ is $O(\log_2(|B(n,k) \setminus V_C|))$ since this list is sorted. Similarly, for all $v \in V_C$, $g^{-1}(v) = f^{-1}(v) - a(f^{-1}(v))$.

In many cases, the size of the set B (k,n)\Vc will be significantly smaller than the size of Vc. For example, for the Golay code [23,11,8] the size of Vc is 3300179 while the size of B(23, 11)\Vc is $$\sum_{i=0}^{11} \binom{n}{i} - 3300179 = 894125.$$

Similarly, for the Reed-Muller code [16,5,8] the size of the set Vc is 5065 while the size of the set B(16, 5)\Vc is 1820.

C. Application to the Blackwell Channel

Figure 2:
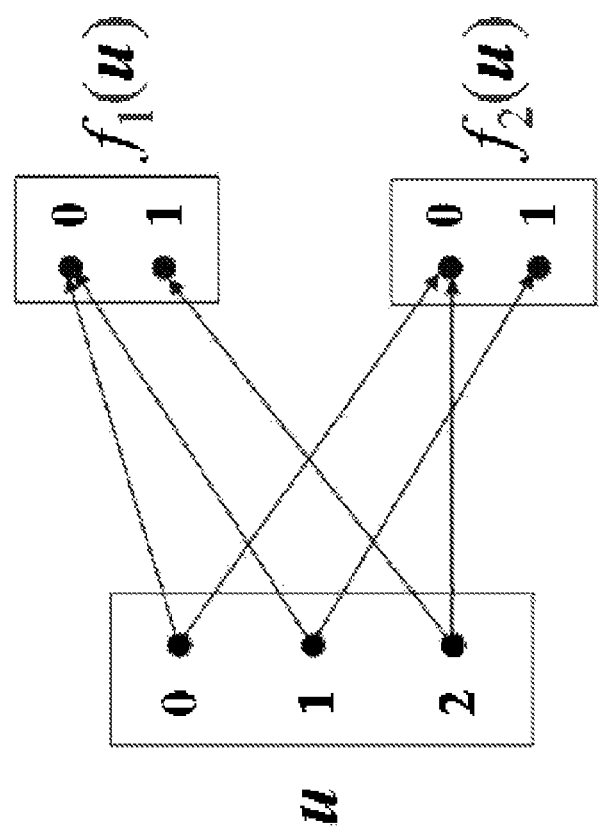
FIG. 2 illustrates a Blackwell channel.

The Blackwell channel, introduced first by Blackwell [1], is one example of a deterministic broadcast channel. The channel is composed of one transmitter and two receivers. The input to the transmitter is ternary and the channel output to each receiver is a binary symbol. Let u be the ternary input vector to the transmitter of length n. For $1 \leq i \leq n$, $f(u_i) = (f(u_i)_1, f(u_i)_2)$, is a binary vector of length two defined as follows (FIG. 2):

$$f(0) = (0,0), f(1) = (0,1), f(2) = (1,0).$$

The binary vectors $f_1(u), f_2(u)$ are defined to be $$f_1(u) = (f(u_1)_1, f(u_2)_1, \ldots, f(u_n)_1),$$

$$f_2(u) = (f(u_1)_2, f(u_2)_2, \ldots, f(u_n)_2),$$

and are the output vectors to the two receivers.

The capacity region of the Blackwell channel was found by Gel'fand [11] and consists of five sub-regions, given by their boundaries:

$$\{(R_1, R_2) | 0 \leq R_1 \leq \tfrac{1}{2}, R_2 = 1\}, \qquad 1)$$

$$\{(R_1, R_2) | R_1 = 1 - p, R_2 = h(p), \tfrac{1}{3} \leq p \leq \tfrac{1}{2}\}, \qquad 2)$$

$$\{(R_1, R_2) | R_1 R_2 = \log_2 3, \tfrac{2}{3} \leq R_1 \leq \log_2 3 - \tfrac{2}{3}\}, \qquad 3)$$

$$\{(R_1, R_2) | R_1 = h(p), R_2 = 1 - p, \tfrac{1}{3} \leq p \leq \tfrac{1}{2}\}, \qquad 4)$$

$$\{(R_1, R_2) | R_1 = 1, 0 \leq R_2 \leq \tfrac{1}{2}\}. \qquad 5)$$

The connection between the Blackwell channel and two-write WOM-codes was identified by Roth [23]. The next theorem shows that from every two-write WOM-code of rate $(R_1, R_2)$ it is possible to construct codes for the Blackwell channel of rates $(R_1, R_2)$ and $(R_2, R_1)$.

Theorem 3.

If $(R_1, R_2)$ is an achievable rate of a two-write WOM-code, then $(R_1, R_2)$ and $(R_2, R_1)$ are achievable rates on the Blackwell channel. Proof Assume that there exists a $[n, 2; 2^{nR_1}, 2^{nR_2}]$ two-write WOM-code and let $E_1, E_2$ and $D_1, D_2$ be its encoding and decoding maps. We maintain that there exists a coding scheme for the Blackwell channel of rate $(R_1, R_2)$. Let $(m_1, m_2) \in \{1, \ldots, 2^{nR_1}\} \times \{1, \ldots, 2^{nR_2}\}$ be two messages and let $v_1 = E_1(m_1)$ and $v_2 = E_2(m_2, v_1)$. Let u be a ternary vector of length n defined as follows. For $1 \leq i \leq n$, $u_i = f^{-1}(v_{1,i}, \overline{v_{2,i}})$. The vector u is well-defined since for all $1 \leq i \leq n$, $(v_{1,i}, \overline{v_{2,i}}) \neq (1,0)$ and hence $(v_{1,i}, \overline{v_{2,i}}) \neq (1,1)$. The vector u is the input to the transmitter. Then, the vector $f_1(u)$ is transmitted to the first receiver and the vector $f_2(u)$ to the second receiver. Note that $f_1(u) = v_1$ and $f_2(u) = \overline{v_2}$. Therefore, the first receiver decodes its message according to $D_1(f_1(u)) = D_1(v_1) = m_1$ and the second receiver decodes its message according to $D_2(\overline{f_2(u)}) = D_2(v_2) = m_2$.

Similarly, it is possible to achieve the rate $(R_2, R_1)$. Now we let $v_2 = E_2(m_2)$ and $v_1 = E_1(m_1, v_2)$. The vector u is defined as $u_i = f^{-1}(\overline{v_{1,i}}, v_{2,i})$ for $1 \leq i \leq n$. The decoded message by the first receiver is $D_1(f_1(u))$ and $D_2(f_2(u))$ is the decoded message by the second receiver.

It is possible to define the Blackwell channel differently such that the forbidden pair of bits is not (1, 1) but another combination. Our construction of the codes can be adjusted accordingly.

Figure 3:
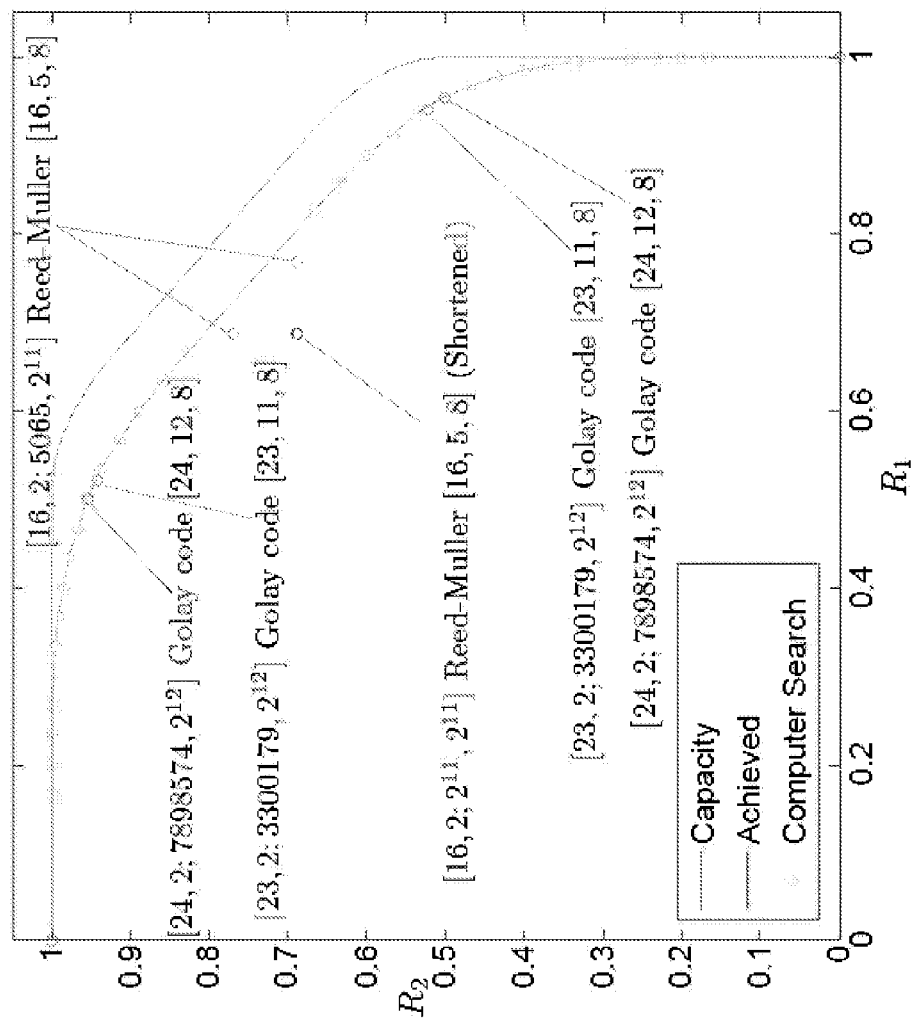
FIG. 3 plots computer search determined rates and theoretical capacity of the Blackwell channel.

Now, we can use our two-write WOM-codes in order to define codes for the Blackwell channel. By using time sharing, the achievable region is convex and hence we get in FIG. 3 the capacity and achieved regions for the Blackwell channel.

Multiple-Write WOM-Codes

The invention also provides WOM-code constructions which reduce the gaps between the upper and lower bounds on the sum-rates of WOM-codes for 3≤t≤10. First, we generalize the two-write WOM-code construction from above for non-binary cells. Then, we show how to use these non-binary two-write WOM-codes in order to construct binary multiple-write WOM-codes. We start with specific constructions for three- and four-write WOM-codes, and then show a general design approach that works for an arbitrary number of writes.

A. Non-Binary Two-Write WOM-Codes

Suppose now that each cell has q levels, where q is a prime number or a power of a prime number. We start by choosing a linear code C[n,k] over GF(q) with a parity-check matrix $\mathcal{R}$ of size (n−k)×n. For a vector v of length n over GF(q), let $\mathcal{R}(v)$ be the matrix $\mathcal{R}$ with zero columns replacing the columns that correspond to the positions of the non-zero values in v. Then we define $$V_c^{(q)} = \{v \in (GF(q))^n | \text{rank}(H(v)) = n - k\}. \quad (3)$$

Next, we construct a non-binary two-write WOM-code [n,2; $|V_c^{(q)}|$, $q^{n-k}$] in a similar manner to the construction in Section IV. Since the proof of the next theorem is very similar to the proof of Theorem 4 we omit it. A complete proof can be found in [18].

Theorem 4.

Let C[n,k] be a linear code with parity-check matrix $\mathcal{R}$ over GF(q) and let $V_c^{(q)}$ be the set defined in (3). Then there exists a q-ary [n,2; $|V_c^{(q)}|$, $q^{n-k}$] two-write WOM-code of sum-rate $$\frac{\log_2 |V_c^{(q)}| + (n-k)\log_2 q}{n}.$$

As was shown in the binary case, there is no restriction on the choice of the linear code C or the parity-check matrix $\mathcal{R}$. Every such code/matrix generates a WOM-code. For a linear code C we define $$\mathcal{R}_1(C) = \frac{\log_2 |V_C^{(q)}|}{n} \text{ and } \mathcal{R}_2(C) = \frac{(n-k)\log_2 q}{n}$$

so the sum-rate of the generated WOM-code is $R_1(C) + R_2(C)$. The capacity region of the achievable rates by this construction is $$C_2^{(q)} = \left\{ (\mathcal{R}_1, \mathcal{R}_2) \mid \exists p \in \left[0, \frac{q-1}{q}\right], \right.$$
$$\left. \mathcal{R}_1 \leq h(p) + p\log_2(q-1), \mathcal{R}_2 \leq (1-p)\log_2(q) \right\}.$$

Theorem 5.

For any $\mathcal{R}'_1, \mathcal{R}'_2) \in C_2^{(q)}$ and $\epsilon > 0$, there exists a linear code C satisfying $R_1(C) \geq R_1 - \epsilon$, $R_2(C) \geq R_2 - \epsilon$.

The next corollary provides the best achievable sum-rate of the construction.

Corollary.

For any q-ary WOM-code generated using our construction, the highest achievable sum-rate is $\log_2(2q-1)$.

Proof: First, note that $$h(p) + p\log_2(q-1) + (1-p)\log_2 q = p\log_2\left(\frac{q-1}{p}\right) + (1-p)\log_2\left(\frac{q}{1-p}\right),$$

and since the function $f(x) = \log_2 x$ is a concave function $$p\log_2\frac{q-1}{p} + (1-p)\log_2\frac{q}{1-p} \leq \log_2\left(p \cdot \frac{q-1}{p} + (1-p)\frac{q}{1-p}\right) =$$
$$\log_2(2q-1).$$

Also, for $$p = \frac{q-1}{2q-1},$$

the achievable sum-rate is $\log_2(2q-1)$. Therefore, there exists a WOM-code produced by our construction with sum-rate $\log_2(2q-1)$.

On the other hand, any WOM-code resulting from our construction satisfies the property that every cell is programmed at most once. This model was studied in Reference [9] and the maximum achievable sum-rate was proved to be $\log_2(2q-1)$. Therefore, our construction cannot produce a WOM-code with a sum-rate that exceeds $\log_2(2q-1)$. ∎

This construction does not achieve high sum-rates for non-binary two-write WOM-codes in general. While the best achievable sum-rate of the construction is $\log_2(2q-1)$, the upper bound on the sum-rate is $\log_2(2q-1)$. The decrease in the sum-rate in our construction results from the fact that cells cannot be programmed twice. That is, if a cell was programmed on the first write, it cannot be reprogrammed on the second write even if it did not reach its highest level. In fact, it is possible to find non-binary two-write WOM-codes with better sum-rates. However, the goal is not to find efficient non-binary WOM-codes. Rather, the non-binary codes that we have constructed can be used in the design of binary multiple-write WOM-codes.

For the construction of binary multiple-write, we use WOM-codes over GF(3). We ran a computer search to find such a ternary two-write WOM-code of sum-rate 2.2205, and we will use this WOM-code in order to construct specific multiple-write WOM-codes.

B. Three-Write WOM-Codes

We start with a construction for binary three-write WOM-codes. The construction uses the WOM-codes found in the previous subsection over GF(3).

Theorem 6.

Let $C_3$ be an [n, 2; $^n\mathcal{R}$, $2^n\mathcal{R}^2$] two-write WOM-code over GF(3) constructed as above in Section A. Then, there exists a [2n, 3:$2^n\mathcal{R}$ $2^n\mathcal{R}^2$, $2^n$] three-write WOM-code of sum-rate $$\frac{R_1 + R_2 + 1}{2}.$$

Proof: We denote by $E_{3,1}$ and $E_{3,2}$ the encoding maps of the first and second writes, and by $D_{3,1}$ and $D_{3,2}$ the decoding maps of the first and second writes of the WOM-code $C_3$, respectively. The 2n cells of the three-write WOM-code we construct are divided into n two-cell blocks, so the memory-state vector is of the form $((c_{1,1}, c_{1,2}), c_{2,1}, c_{2/2}), \ldots, (c_{n,1}, c_{n,2}))$. In this construction we also use map $\phi: GF(3) \rightarrow (GF(2), GF2))$ defined as follows:

$$\phi(0)=(0,0),$$

$$\phi(1)=(1,0),$$

$$\phi(2)=(0,1),$$

The map $\phi$ extends naturally to ternary vectors $v=(v_1, \ldots, v_n) \in GF(3)^n$ using the rule $$\phi(v)=(\phi(v_1), \ldots, \phi(v_n)),$$

On the pairs (c,c') in the image of $\phi$, we define $\phi^{-1}(c,c')$ to indicate the inverse function. The map $\phi^{-1}$ is extended similarly to work over vectors of such bit pairs. We are now ready to describe the encoding and decoding maps for a three-write WOM-code.

1) On the first write, a message in from the set $\{1, \ldots, 2^n \mathcal{R}^1\}$ is written in the 2n cells:

$$\epsilon_1(m)=\phi(\epsilon_{3,1}(m)).$$

The decoding map is defined similarly, where c is the memory-state vector:

$$\mathcal{D}_1(c)=\mathcal{D}_{3,1}(\phi^{-1}(c)).$$

2) On the second write, a message in from the set $\{1, \ldots, 2^n \mathcal{R}^2\}$ is written in the 2n cells as follows. Let c be the programmed vector on the first write. Then, $$\epsilon_2(m,c)=\phi(\epsilon_{3,2}(m,\phi^{-1}(c)).$$

That is, first the memory-state vector c is converted to a ternary vector. Then, it is encoded using the encoding $E_{3,2}$ and the new message, producing a new ternary memory-state vector. Finally, the last vector is converted to a 2n-bit vector. The decoding map is defined as on the first write:

$$\mathcal{D}_2(c)=\mathcal{D}_{3,2}(\phi^{-1}(c)).$$

According to the construction of the WOM-code $C_3$, no ternary cell is programmed twice and therefore each of the n pairs of bits is programmed at most once.

3) On the third write, an n-bit vector v is written. Let $c=((c_{1,1}, c_{1,2}), \ldots, (c_{n,1}, c_{n,2}))$ be the current memory-state vector. Then, $$E_3(v,c)=((c'_{1,1}, c'_{1,2}), \ldots, (c'_{n,1}, c'_{n,2}))$$

is a vector, defined as follows. For $1 \le i \le n$, $Yc'_{i,1}, c'_{i,2})=(1,1)$ if $v_i=1$ and otherwise $(c'_{i,1}, c'_{i,2})$. It is always possible to program the pair of bits to be (1, 1) since at most one cell in each pair was previously programmed. The decoding map $D_2(c)$ is defined to be $$D_2(c)=(c_{1,1} \cdot c_{1,2}, \ldots, c_{n,1} \cdot c_{n,2}).$$

That is, the decoded value of each pair of bits is one if and only if the value of both of them is one.

Corollary.

The best achievable sum-rate of a three-write WOM-code using this construction is $(\log_2 5+1)/2 \approx 1.66$.

Proof: Given a two-write WOM-code $C_3$ over GF(3) with rates $(R_1, R_2)$, the constructed binary three-write WOM-code has rates $(R_1/2, R_2/2, \frac{1}{2})$ and its sum-rate is $R=(R_1+R_2+1)/2$. This sum-rate is maximized when $R_1+R_2$ is maximized. But $R_1+R_2$ is the sum-rate of the two-write WOM-code over GF(3), which was proven in Corollary 9 to be maximized at $\log_2 5$. Then the maximum achievable sum-rate of the constructed binary three-write WOM-code is $$\frac{\log_2 5+1}{2} \approx 1.66.$$

Using the construction of WOM-codes over GF(3) presented above, we can construct a three-write WOM-code of sum-rate $(2.2205+1)/2=1.6102$.

C. Four-Write WOM-Codes

We next present a construction for four-write binary WOM-codes.

Theorem 7.

Let $C_3$ be an $[n,2;2^{nR_{3,1}}, 2^{nR_{3,2}}]$ two-write WOM-code over Equation (2) constructed as above. Let $C_2$ be an $[n,2;2^{nR_{2,1}}, 2^{nR_{2,2}}]$ binary two-write WOM-code. Then, there exists a $[2n,4;2^{nR_{3,1}}, 2^{nR_{3,2}}, 2^{nR_{2,1}}2^{nR_{2,2}}]$ four-write WOM-code of sum-rate $$\frac{R_{3,1}+R_{3,2}+R_{2,1}+R_{2,2}}{2}.$$

Proof: The proof is very similar to the one used for three-write WOM-codes. We denote by $E_{3,1}$, $E_{3,2}$ the encoding maps of the first and second writes, and by $D_{3,1}$, $D_{3,2}$ the decoding maps of the first and second writes of the WOM-code $C_3$, respectively. Similarly, the encoding and decoding maps of the WOM-code $C_2$ for the first and second writes are denoted by $E_{3,1}$, $E_{3,2}$ and $D_{3,1}$, $D_{3,2}$, respectively. Using the encoding and decoding maps of $C_3$, we define the first and second writes of our constructed four-write WOM-code as we did for the first and second writes of the three-write WOM-codes. The third and fourth writes are defined in a similar way, as follows.

1) On the third write, a message m from the set $\{1, \ldots, 2^{nR_{2,1}}\}$ is written. Let $(\xi_{2,1}(m)=v=(v_1, \ldots, v_n)$
and let $c=((C_{1,1}, C_{1,2}), \ldots, (c_{n,1}, c_{n,2}))$ be the current memory-state vector. Then, $$\epsilon_3(m,c)=((c'_{1,1}, c'_{1,2}), \ldots, (c'_{n,1}, c'_{n,2})),$$

where for $1 \le i \le n$, $(c'_{i,1}, c'_{i,2})=(1,1)$ if $v_i=1$ and, otherwise, $(c'_{1,1}, c'_{1,2})=(c_{i,1}, c_{i,2})$. The decoding map $D_{3(c)}$ is defined to be $$D_3(c)=D_{2,1}(c_{1,1} \cdot c_{1,2}, \ldots, c_{n,1} \cdot c_{n,2}).$$

2) On the fourth write, a message m from the set $\{1, \ldots, 2^n \mathcal{R}^{2,2}\}$ is written. Let $$\epsilon_{2,2}(m,(c_{1,1} \cdot c_{1,2}, \ldots, c_{n,1} \cdot c_{n,2}))=v=(v_1, \ldots, v_n),$$

where $c=((c_{1,1}, c_{1,2}), \ldots, (c_{n,1}, c_{n,2}))$ is the current memory-state vector. Then, $$\epsilon_4(m,c)=((c_{1,1}', c_{1,2}'), \ldots, (c_{n,1}', c_{n,2}')),$$

where for $1 \le i \le n$, $(c'_{1,1}, c'_{1,2})=(1,1)$ if $v_i=1$ and, otherwise, $(c_{i,1}', c_{i,2}')=(c_{i,1}, c_{i,2})$. The decoding map $D_4(c)$ is defined, as before, by $$\mathcal{D}_4(c)=\mathcal{D}_{2,2}(c_{1,1}' \cdot c_{1,2}', \ldots, c_{n,1}' \cdot c_{n,2}').$$

The last theorem requires both the binary two-write and ternary two-write WOM-codes to have the same number of cells, n. However, we can construct a four-write binary WOM-code using any two such WOM-codes, even if they do not have the same number of cells. Suppose we have a WOM-code over GF(3) with $n_1$ cells and binary WOM-code with $n_2$ cells. Both codes can be extended to use $(n_1,n_2)$ cells. Then, the construction above will give a four-write WOM-code.

Corollary.

The best achievable sum-rate of a four-write WOM-code using this construction is $(\log_2 5+\log_2 3)/2 \approx 1.95$.

Proof: The maximum value of $R_{3,1}+R_{3,2}$ is $\log_2 5$ and the maximum value of $R_{2,1}+R_{2,2}$ is $\log_2 3$. Therefore, the maximum sum-rate of the constructed $$\frac{\log_2(5)+\log_2(3)}{2} \approx 1.95.$$

If we use the WOM-code over GF(3) of sum-rate 2.2205 found in the previous subsection as the WOM-code $C_3$ and the binary two-write WOM-code of sum-rate 1.4928 found as the WOM-code $C_2$, then there exists a four-write WOM-code of sum-rate $(2.2205+1.4928)/2=1.8566$.

C. Multiple-Write WOM-Codes

The construction of three- and four-write WOM-codes can be easily generalized to an arbitrary number of writes. We state the following theorem and skip its proof since it is very similar to the proofs of the corresponding theorems for three- and four-write WOM-codes.

Theorem 8.

Let $C_3$ be an $[n,2; 2^n\mathcal{R}^{3,1}, 2^n\mathcal{R}^{3,2}]$ two-write WOM-code over GF(3) constructed as above. Let $C_2$ be an $[n,t-2; 2^n\mathcal{R}^{2,1}, \ldots, 2^n\mathcal{R}^{2i-2}]$ binary $(t-2)$-write WOM-code. Then, there exists a $$[2n,t;2^{nR_{3,1}},2^{nR_{3,2}},2^{nR_{2,1}},\ldots,2^{nR_{2t-2}}]$$

t-write WOM-code of sum-rate $$\frac{\mathcal{R}_{3,1}+\mathcal{R}_{3,2}+\sum_{i=1}^{t-2}\mathcal{R}_{2,i}}{2}.$$

Theorem 14 implies that if there exists a $(t-2)$-write WOM-code of sum-rate $R_{t-2}$ then there exists a t-write WOM-code of sum-rate $$R_t = \frac{\log_2 5 + R_{t-2}}{2}.$$

The following corollary summarizes the possible achievable sum-rates of t-write WOM-codes.

Corollary.

For $t \geq 3$, there exists a t-write WOM-code of sum-rate $$\mathcal{R}_t = \begin{cases} \frac{(2^{\frac{t-1}{2}}-1) \cdot \log_2 5 + 1}{2^{\frac{t-1}{2}}}, & t \text{ odd} \\ \frac{(2^{\frac{t-2}{2}}-1) \cdot \log_2 5 + \log_2 3}{2^{\frac{t-2}{2}}}, & t \text{ even.} \end{cases}$$

If we use again the two-write WOM-code over GF(3) of sum-rate 2.2205 and the binary two-write WOM-code of sum-rate 1.4928 from Section IV, then for $t \geq 3$ we obtain a t-write WOM-code of sum-rate $R_t$, where $$\mathcal{R}_t = \begin{cases} \frac{(2^{\frac{t-1}{2}}-1) \cdot 2.22 + 1}{2^{\frac{t-1}{2}}}, & t \text{ odd} \\ \frac{(2^{\frac{t-2}{2}}-1) \cdot 2.22 + 1.4928}{2^{\frac{t-2}{2}}}, & t \text{ even.} \end{cases}$$

Concatenated WOM-Codes

The construction presented in the previous section provides us with a family of WOM-codes for all $t \geq 3$. In this section, we will show a general scheme to construct more families of WOM-codes. In fact, the construction in the previous section is a special case of this general scheme.

Theorem 9.

Let $C^*$ be $[m, t/2; q_1, \ldots, q_{t/2}]$ binary $t/2$-write WOM-code where t is an even integer. For $1 \leq I \leq t/2$, let $C_i$ be an $[n, 2; 2^{nR_i}, 1, 2^{nR_i}, 2]$ two-write WOM-code over $GF(q_i)$, as constructed above. Then, there exists an $[nm, 2^n\mathcal{R}^{1,1}, 2^n\mathcal{R}^{1,2}, \ldots, 2^n\mathcal{R}^{1/2,1}, 2^n\mathcal{R}^{1/2,2}, t]$ binary t-write WOM-code of sum-rate $$\sum_{i=1}^{t/2} \frac{R_{i,1}+R_{i,2}}{m}.$$

Proof: For $1>i>t/2$, let $\xi_i^* \mathcal{D}_i^*$ be the encoding, decoding maps on the i-th write of the WOM-code $C^*$, respectively. The definition of $\xi_i^* \mathcal{D}_i^*$ for $1>i>t/2$, extends naturally to vectors by simply invoking the maps on each entry in the vector. Similarly, for $1 \leq i \leq t/2$, let us denote by $E_{i,1}$ and $E_{i,2}$ the encoding maps of the first and second writes, and by $D_{i,1}$ and $D_{i,2}$ the decoding maps of the first and second writes of the WOM-code Ci, respectively. We will present the specification of the encoding and decoding maps of the constructed t-write WOM-code.

In the following definitions of the encoding and decoding maps, we consider the memory-state vector c to have n symbols of m bits each, i.e. $c \in (GF(2^m))^n$. For $1 \leq i \leq t/2$, the $(2i-1)$-st write and 2i-th write are implemented as follows.

1. On the $(2i-1)$-st write, a message $m_1 \in \{1, \ldots, 2^n\mathcal{R}^{i,1}\}$ is written to the memory-state vector c according to $$\xi_{2i-1}(m_1,c)=\xi_i^*(\xi_{i,1}(m_1),c).$$

The memory-state vector c is decoded according to $$\mathcal{D}_{2i-1}(c)=\mathcal{D}_{i,1}(\mathcal{D}_i^*(c)).$$

On the 2i-th write, a message $m_2 \in \{1, \ldots, 2^{nR_i,1}\}$ is written according $$\epsilon_{2i}(m_2)=\epsilon_i^*(\epsilon_{i,2}(m_2, \mathcal{D}_i^*(c)),c)$$

and the memory-state vector c is decoded according to $$\mathcal{D}_{2i}(c)=\mathcal{D}_{i,2}\mathcal{D}_i^*(c)).$$

We will demonstrate how this construction works in the following example.

Example 3

Figure 4:
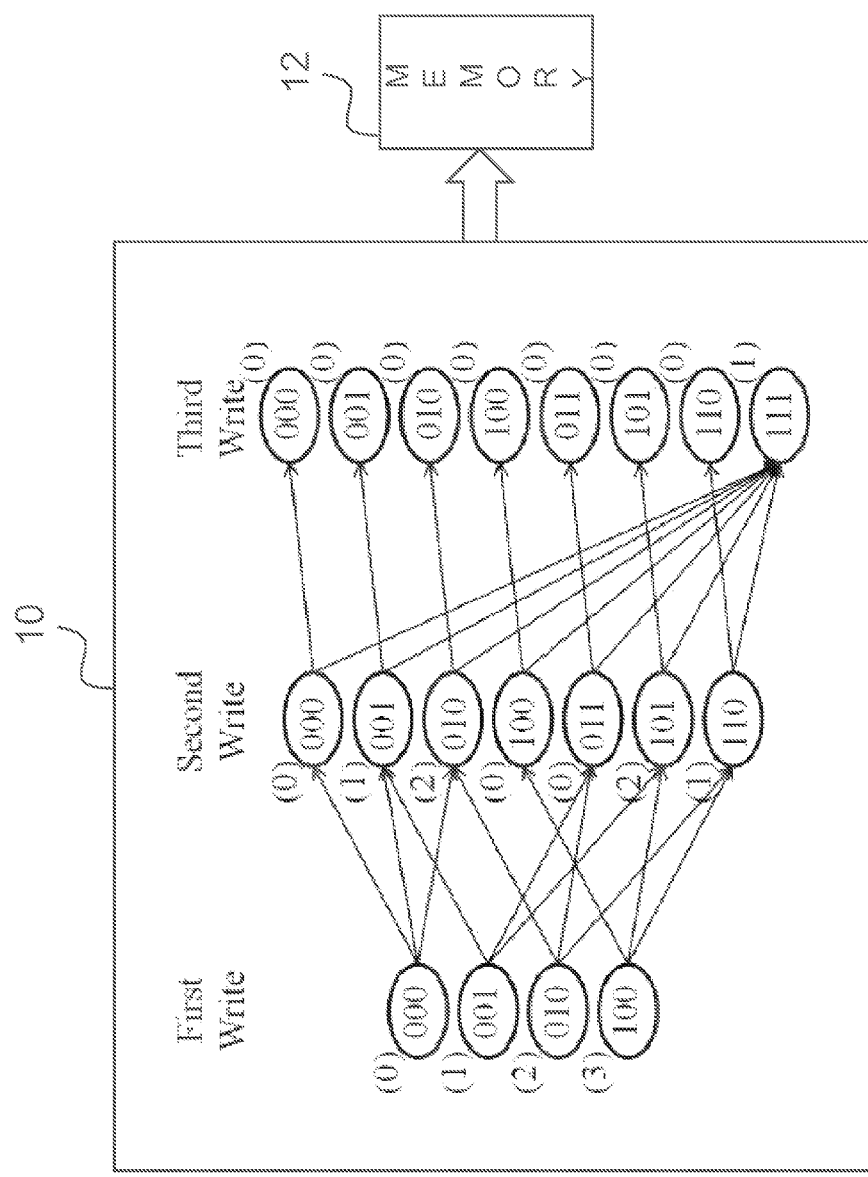
FIG. 4 illustrates a [3,3:4,3,2] three-write WOM-code.

We choose a [3,3;4,3,2] three-write WOM-code as the code $C^*$. This code is depicted in FIG. 4 by a state diagram of an encoding map describing all three writes implanted in an encoder 10 to write to memory 12. The three-bit vector in each state is the memory-state and the number next to it is the decoded value. We need to find three more two-write WOM-codes over GF(4),GF(3), and GF(2). For the code $C_l$ over

TABLE 1

SUM-RATES OF CONCATENATED WOM-CODES

| Number of Writes | Achieved New Rate | Maximum New Rate |
|---|---|---|
| 5 | 1.9689 | $\frac{\log_2 7 + \log_2 5 + 1}{3} = 2.0431$ |
| 6 | 2.1331 | $\frac{\log_2 7 + \log_2 5 + \log_2 3}{3} = 2.2381$ |
| 7 | 2.1723 | $\frac{\log_2 7 + \log_2 5 + (\log_2 5 + 1)/2}{3} = 2.2634$ |
| 8 | 2.2544 | $\frac{\log_2 7 + \log_2 5 + (\log_2 5 + \log_2 3)/2}{3} = 2.3609$ |
| 9 | 2.2918 | $\frac{\log_2 7 + \log_2 5 + (\log_2 7 + \log_2 5 + 1)/3}{3} = 2.3908$ |
| 10 | 2.3466 | $\frac{\log_2 7 + \log_2 5 + (\log_2 7 + \log_2 5 + \log_2 3)/3}{3} = 2.4588$ |

GF(4), we ran a computer search to find a two-write WOM-code over GF(4) of sum-rate 2.6862. For the code $C_2$ over GF(3), we use the code with sum-rate 2.22 which we found above, and we use the binary two-write WOM-code of sum-rate 1.4928 for the code $C_3$. Then, the sum-rate of the six-write WOM-code is $$\frac{2.6793 + 2.22 + 1.49}{3} = 2.1297.$$

It is possible to construct a five-write WOM-code by writing a vector of n bits in the last write so its sum-rate is $$\frac{2.6862 + 2.2205 + 1}{3} = 1.9689.$$

Note that if one of the codes in the general construction is binary then we can actually use a WOM-code that allows more than two writes. That is, in this construction we can use any binary multiple-write WOM-code as the WOM-code $C_3$. Therefore, we can generate another family of WOM-codes for $t \geq 5$. Their maximum achievable sum-rates are given by the following formula $$\mathcal{R}_t = \frac{\log_2 7 + \log_2 5 + \mathcal{R}_{t-4}}{3},$$

for $t \geq 5$ and $R_{t-4}$ is the maximum achievable sum-rate for a (t−4)-write WOM-code. Similarly, the constructed codes which we obtain using the WOM-codes found above have sum-rates $$\mathcal{R}'_t = \frac{2.6862 + 2.2205 + \mathcal{R}'_{t-4}}{3},$$

where $\mathcal{R}_{t-4}'$ is the best sum-rate of a constructed (t−4)-write WOM-code. Table IV summarizes these sum-rates.

Note that the construction is a special case of the generalized concatenated WOM-codes construction in which the WOM-code C* is chosen to be a [2,2; 3, 2] binary two-write WOM-code.

The general method described in Theorem 7 provides us with many more families of WOM-codes. However, in order to construct WOM-codes with high sum-rates, the WOM-code C* has to be chosen very carefully. In particular, it is important to choose such a WOM-code with as few cells as possible, since the sum of all sum-rates of the non-binary two-write WOM-codes is averaged over the number of cells of the WOM-code C*. As the number of short WOM-codes is small, there are only a small number of possibilities to check. However, our search for better WOM-codes with between six and ten writes using WOM-codes with few cells did not lead to any better results.

Fixed-Rate WOM-Codes

The WOM-code construction for more than two writes improved the achieved sum-rates only in the unrestricted-rate case. In this section, we present a method to construct fixed-rate WOM-codes. The method is recursive and is based on the previously constructed unrestricted-rate WOM-codes.

Theorem 10.

Let C be an $[n,t;2^{nR_1},2^{nR_2},\ldots,2^{nR_1}]$ t-write WOM-code. Assume that for $1 \leq i \leq t-1$ there exists a fixed-rate WOM-code of sum-rate $R_i$. Let $R'_1, \ldots, R'_i$ be a permutation of $R_1, \ldots, R_1$ such that $R'_1 \geq \ldots, \geq R'_1$. Then, there exists a fixed-rate t-write WOM-code of sum-rate $$\frac{t \cdot \mathcal{R}'_1}{1 + \sum_{i=1}^{t-1} \frac{i(\mathcal{R}'_{t-i} - \mathcal{R}'_{t-i+1})}{R_i}}.$$

Proof: For simplicity, let us assume that $R_1 \geq \ldots \geq R_t$ as it will be clear from the proof how to generalize to the arbitrary case. First, we add $(\mathcal{R}_{t-1} - \mathcal{R}_t)_n$ more cells in order to write $(\mathcal{R}_{t-1} - \mathcal{R}_t)_n$ bits on the last write. This guarantees that the rates on the last two writes are the same. Then, we add $2(R_{t-2} - R_{t-1})n/R_2$ more cells in order to write $(R_{t-2} - R_{t-1})$ n more bits on each of the last two writes. This part of the last two writes is invoked using the fixed-rate two-write WOM-code of sum-rate $R_2$ and therefore the additional number of cells is $2(\mathcal{R}_{t-2} - \mathcal{R}_{t-1})n/R_2$. This addition of cells guarantees that the rates on the last three writes are all the same. In general, for $1 \leq i \leq t-1$ we add $i(\mathcal{R}_{t-i} - \mathcal{R}_{t-i+1})n/R_i$ more cells such that $(\mathcal{R}_{t-i} - \mathcal{R}_{t-i+1})^n$ more bits are written on each of the last i writes and therefore the rates on the last i+1 writes are all the same. These bits are written using the fixed-rate i-write WOM-code which is assumed to exist.

With the addition of these cells, the number of bits written on the i-th write for $1 \leq i \leq t$ is $$\mathcal{R}_i n + \sum_{j=1}^{i-1} (\mathcal{R}_j - \mathcal{R}_{j+1})n = \mathcal{R}_1 n.$$

Thus, the rates on all writes are the same and the generated WOM-code is fixed-rate.

The total number of bits we add is $$\sum_{i=1}^{t-1} \frac{i(\mathcal{R}_{t-i} - \mathcal{R}_{t-i+1})n}{R_i},$$

and thus the sum-rate is $$\frac{t \cdot \mathcal{R}_1 n}{n + \sum_{i=1}^{t-1} \frac{i(\mathcal{R}_{t-i} - \mathcal{R}_{t-i+1})n}{R_i}} = \frac{t \cdot \mathcal{R}_1}{1 + \sum_{i=1}^{t-1} \frac{i(\mathcal{R}_{t-i} - \mathcal{R}_{t-i+1})}{R_i}}.$$

Let us demonstrate how to apply the last theorem. We start with the three-write WOM-code. Its rates on the first, second, and third writes are 0.6291, 0.4811, 0.5, respectively. We add 0.0189n more cells in order to guarantee that the rates on the last two writes are the same. Then we use the fixed-rate two-write WOM-code of sum-rate 1.4546. Hence we add $$\frac{2 \cdot (0.6291 - 0.5)n}{1.4546} = 0.1775n$$

more cells, yielding a fixed-rate three-write WOM-code of sum-rate $$\frac{3 \cdot 0.6291}{1.1964} = 1.5775.$$

If we used the best fixed-rate two-write WOM-code of sum-rate 1.546 and the best three-write WOM-code of sum-rate 1.66, then we get a fixed-rate three-write WOM-code of sum-rate 1.6263.

Note that we could use a two-write WOM-code such that 0.0189n bits are written on its first write and 0.1291n bits are written on its second write. This will indeed add another small improvement to the sum-rate, however this scheme is not easy to generalize. Our goal here is to give a general method. We are aware that for each individual case it is possible to use other unrestricted-rate WOM-codes that will provide a WOM-code of the desired sum-rate with slightly fewer cells.

Now we move to consider the four-write WOM-code. Its component rates are 0.6291, 0.4811, 0.413, 1/3. We add three more groups of cells as follows:

1) $(0.413 - 1/3)n = 0.0797n$ more cells, so that the last two write have the same rate.
2) $2 \cdot (0.4811 - 0.413)n/1.4546 = 0.0936n$ more cells, so that the last three writes have the same rate.
3) $3 \cdot (0.6291 - 0.4811)n/1.5731 = 0.2822n$ more cells, so that the last four writes have the same rate.

Then, we get a fixed-rate four-write WOM-code with sum-rate $$\frac{4 \cdot 0.6291}{1 + 0.0797 + 0.0936 + 0.2822} = 1.7298.$$

If we used the best fixed-rate two- and three-write WOM-codes and the best unrestricted-rate four-write WOM-code, then we obtain a fixed-rate four-write WOM-code of sum-rate 1.8249. Fixed-rate t-write WOM-code for t>4 can be similarly obtained. We summarize the results for the sum-rates that we actually found and the best ones we could find in this method in Table 2.

TABLE 2

SUM-RATES OF FIXED-RATE WOM-CODES

| Number of Writes | Achieved Sum-rate | Maximum Sum-rate |
|---|---|---|
| 3 | 1.5775 | 1.6263 |
| 4 | 1.7298 | 1.8249 |
| 5 | 1.8794 | 1.9302 |
| 6 | 1.9742 | 2.0570 |
| 7 | 1.991 | 2.0692 |
| 8 | 2.0375 | 2.1190 |
| 9 | 2.0951 | 2.1702 |
| 10 | 2.1327 | 2.2189 |

Tables 3 and 4 show a comparison of the sum-rates of unrestricted-rate and fixed-rate WOM-codes presented in this application and the best previously known sum-rates for 2≤t≤10. The column labeled "Best Prior" is the highest sum-rate achieved by a previously reported t-write WOM-code. The column "Achieved New Sum-rate" gives the sum-rates that we actually obtained through application of the new techniques. The column "Maximum New Sum-rate" lists the maximum possible sum-rates that can be obtained using our approach. Finally, the column "Upper Bound" gives the maximum possible sum-rates for t-write WOM-codes.

For unrestricted-rate two-write WOM-codes, the results were found by the computer search method. For three and four writes, we used the WOM-codes described for multiple writes, and for 5≤t≤10, we used the WOM-codes discussed for concatenated code. For fixed-rate two-write WOM-codes, we again used the computer search method of this Section providing two write codes. The constructions for more than two writes were obtained by application of Theorem 10.

TABLE 3

COMPARISON WITH KNOWN UNRESTRICTED-RATE WOM-CODES

| Number of Writes | Best Prior | Achieved New Sum-rate | Maximum New Sum-rate | Upper Bound |
|---|---|---|---|---|
| 2 | 1.3707 | 1.4928 | 1.585 | 1.585 |
| 3 | 1.5302 | 1.6102 | 1.661 | 2 |
| 4 | 1.7524 | 1.8566 | 1.9534 | 2.3219 |
| 5 | 1.7524 | 1.9689 | 2.0431 | 2.585 |
| 6 | 1.7524 | 2.1331 | 2.2381 | 2.8074 |
| 7 | 1.8232 | 2.1723 | 2.2634 | 3 |
| 8 | 1.8824 | 2.2544 | 2.3609 | 3.1699 |
| 9 | 1.9535 | 2.2918 | 2.3908 | 3.3219 |
| 10 | 2.0144 | 2.3466 | 2.4588 | 3.4594 |

TABLE 4

COMPARISON WITH KNOWN FIXED-RATE WOM-CODES

| Number of Writes | Best Prior | Achieved New Sum-rate | Maximum New Sum-rate | Upper Bound |
|---|---|---|---|---|
| 2 | 1.343 | 1.4546 | 1.546 | 1.546 |
| 3 | 1.4348 | 1.5775 | 1.6263 | 1.9366 |
| 4 | 1.6042 | 1.7298 | 1.8249 | 2.2436 |
| 5 | 1.6279 | 1.8794 | 1.9302 | 2.4965 |
| 6 | 1.7143 | 1.9742 | 2.0570 | 2.7120 |
| 7 | 1.8232 | 1.991 | 2.0692 | 2.9001 |
| 8 | 1.8824 | 2.0375 | 2.1190 | 3.0664 |
| 9 | 1.9535 | 2.0951 | 2.1702 | 3.2157 |
| 10 | 2.0144 | 2.1327 | 2.2189 | 3.3520 |

REFERENCES

[1] D. Blackwell, "Statistics 262," Course taught at the University of California, Berkeley, Spring 1963.
[2] T. Berger, F. Jelinek, and J. K. Wolf, "Permutation codes for sources," *IEEE Trans. Inform. Theory*, vol. 18, no. 1, pp. 160-168, January 1972.
[3] R. Brent, S. Gao, and A. Lauder, "Random Krylov spaces over finite fields," *SIAM J. Discrete Math*, vol. 16, no. 2, pp. 276-287, February 2003.
[4] P. Cappelletti, C. Golla, P. Olivo, and E. Zanoni, *Flash Memories*, Boston: Kluwer Academic, 1999.
[5] G. D. Cohen, P. Godlewski, and F. Merkx, "Linear binary code for writeonce memories," *IEEE Trans. Inform. Theory*, vol. 32, no. 5, pp. 697- 700, October 1986.
[6] J. H. Conway and N. J. Sloane, "Orbit and coset analysis of the Golay and related codes," *IEEE Trans. Inform. Theory*, vol. 36, no. 5, pp. 1.038-1050, September 1990.
[7] T. M. Cover, "Enumerative source encoding," *IEEE Trans. Inform. Theory*, vol. 19, no. 1, pp 73-77, January 1973.
[8] A. Fiat and A. Shamir, "Generalized "write-once" memories," *IEEE Trans. Inform. Theory*, vol. 30, no. 3, pp. 470-480, September 1984.
[9] F. Fu and A. J. Han Vinck, "On the capacity of generalized write-once memory with state transitions described by an arbitrary directed acyclic graph," *IEEE Trans. Inform. Theory*, vol. 45, no. 1, pp. 308-313, September 1999.
[10] E. Gal and. S. Toledo, "Algorithms and data structures for flash memories," *ACM Computing Surveys*, vol. 37, pp. 138-163, June 2005.
[11] S. I. Gel'fand, "Capacity of one broadcast channel," *Problemy Peredachi Informatsii*, vol. 13, no. (3), pp. 106-108, 1977.
[12] P. Godlewski, "WOM-codes construits a partir des codes de Hamming," *Discrete Math.*, vol. 65, no. 3, pp. 237-243, July 1987.
[13] L. Grupp, A. Caulfield, J. Coburn, S. Swanson, E. Yaakobi, P. H. Siegel, and J. K. Wolf, "Characterizing flash memory: anomalies, observations, and applications," *MICRO-42*, pp. 24-33, December 2009.
[14] c. Heegard, "On the capacity of pelinanent memory," *IEEE Trans. Inform. Theory*, vol. 31, no. 1, pp. 34-42, January 1985.
[15] A. Jiang, "On the generalization of error-correcting WOM codes," *Proc. IEEE Int. Symp. Inform. Theory*, pp. 1391-1395, Nice, France, June 2007.
[16] A. Jiang, V. Bohossian, and J. Bruck, "Floating codes for joint information storage in write asymmetric memories," *Proc. IEEE Int. Symp. Inform. Theory*, pp. 1166-1170, Nice, France, June 2007.
[17] A. Jiang and J. Bruck, "Joint coding for flash memory storage," *Proc. IEEE Int. Symp. Inform. Theory*, pp. 1741-1745, Toronto, Canada, July 2008.
[18] S. Kayser, E. Yaakobi, P. H. Siegel, A. Vardy, and J. K. Wolf, "Multiplewrite WOM-codes," *Proc. 48-th Annual Allerton Conference on Communication, Control and Computing*, Monticello, Ill., September 2010. [19] D. E. Knuth, "Efficient balanced codes," *IEEE Trans. Inform. Theory*, vol. 32, no. 1, pp. 51-53, January 1986.
[20] H. Mandavifar, P. H. Siegel, A. Vardy, J. K. Wolf, and E. Yaakobi, "A nearly optimal construction of flash codes," *Proc. IEEE Int. Symp. Inform. Theory*, pp. 1239-1243, Seoul, Korea, July 2009.
[21] F. Merkx, "Womcodes constructed with projective geometries," *Traitement du signal*, vol. 1, no. 2-2, pp. 227-231, 1984.
[22] R. L. Rivest and A. Shamir, "How to reuse a write-once memory," *Inform. and Contr.*, vol. 55, no. 1-3, pp. 1-19, December 1982.
[23] R. M. Roth, February 2010, personal communication.
[24] R. M. Roth, *Introduction to Coding Theory*, Cambridge University Press, 2005.
[25] J. P. M. Schalkwijk, "An algorithm for source coding," *IEEE Trans. Inform. Theory*, vol. 18, no. 3, pp. 395-399, May 1972.
[26] c. Tian, V A. Vaishampayan, and N. J. A. Sloane, "Constant Weight codes: a geometric approach based on dissections,", *CiteSeerX—Scientific Literature Digital Library and Search Engine*, 2010.
[27] J. K. Wolf, A. D. Wyner, J. Ziv, and J. Korner, "Coding for a write-once memory," *AT&T Bell Labs. Tech. J.*, vol. 63, no. 6, pp. 1089-1112, 1984.
[28] Y. Wu, "Low complexity codes for writing write-once memory twice," *Proc. IEEE Int. Symp. Inform. Theory*, pp. 1928-1932, Austin, Tex., June 2010.
[29] Y. Wu and A. Jiang, "Position modulation code for rewriting write-once memories," acceptted by *IEEE Trans. Inform. Theory*, October 2010.
[30] E. Yaakobi, S. Kayser, P. H. Siegel, A. Vardy, and J. K. Wolf, "Efficient two-write WOM-codes," *Proc. IEEE Inform. Theory Workshop*, Dublin, Ireland, August 2010.
[31] E. Yaakobi, J. Ma, L. Grupp, P. H. Siegel, S. Swanson, and J. K. Wolf, "Error characterization and coding schemes for flash memories," *Proc. Workshop on the Application of Communication Theory to Emerging Memory Technologies*, Miami, Fla., December 2010.
[32] E. Yaakobi, P. H. Siegel, A. Vardy, and J. K. Wolf, "Multiple errorconecting WOM-codes," *Proc. IEEE Int. Symp. Inform. Theory*, pp. 1933-1937, Austin, Tex., June 2010.
[33] G. Zernor, "Problemes combinatoires lies it l'ecriture sur des mernoires," Ph.D. Dissertation, ENST, Paris, France, November 1989.
[34] G. Zemor and G. D. Cohen, "Error-correcting WOM-codes," *IEEE Trans. Inform. Theory*, vol. 37, no. 3, pp. 730-734, May 1991.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for writing data to a non transient medium using WOM-codes to provide a guaranteed number of multiple writes, the method comprising steps of:

defining, in an electronic encoder, a parity check matrix $H_v$ for a linear code $C[n,k]$ to code the data such that the i-th column of $H_v$, $1 \leq i \leq n$, is the i-th column of H if $v_i=0$ and otherwise it is a zeros column, wherein $\{v_1, v_2, \ldots v_{|V_c|}\}$ is an ordering of a set of memory vectors Vc;

defining, in the encoder, a set Vc of memory vectors $s_1$ such that each vector v has a rank as follows:

$$V_c = \{v \in \{0,1\}^n | \text{rank}(\mathcal{R}_v) = n-k\}$$

writing, by the encoder, a symbol to the non transient medium over an alphabet of size |Vc|.

2. The method of claim 1, further comprising: on a second write, writing, by the encoder, a second vector $s_2$ of n−k bits to the non transient medium, wherein $v_1$ is the programmed vector on the first write, $s_1 = H_{v1}$, then $E_2(s_2, v_i) = v_1 + V_2$, and $v_2$ is a solution of the equation $H_v \cdot v_2 = s_1 + s_2$.

3. A method for decoding data encoded on a transient medium according to claim 2, comprising reading data from the transient medium and applying, by an electronic decoder, a decoding map such that $D_2$, if c is the vector of programmed cells of the transient medium, then the decoded value of the n−k bits is given by $D_2(c) = H \cdot c = H \cdot v_1 + H \cdot v_2 = s_1 + s_2 = s_2$.

4. The method of claim 1, applied to a linear code, such that the parity check matrix $H_v$ is selected uniformly at random and an indicator random variable $X_v(H)$ on the space of all matrices as follows $$X_v(H) = \begin{cases} 1 & \text{if } v \in V_C \\ 0 & \text{otherwise} \end{cases}.$$

5. The method of claim 1, wherein the non transient medium comprises a memory having cells that can change state from zero to one but not from one to zero except upon an erase of the entire memory, and said writing writes the symbol into cells without the erase of the entire memory.

6. The method of claim 1, wherein the guaranteed number of writes is three, and said writing data comprises 1) on a first write, a message m from a set $\{1, \ldots, 2^{nR_1}\}$ is written in $2n$ cells:

$\epsilon_1(m) = \phi(\epsilon_{3,1}(m))$, 2) on a second write, a message m from the set $\{1, \ldots, 2^{nR_2}\}$ is written in the 2n cells, wherein c is a programmed vector on the first write, where $\epsilon_2(m,c) = \phi(\epsilon_{3,2}(m, \phi^{-1}(c)))$, such that first the memory-state vector c is converted to a ternary vector and then the ternary vector is encoded using the encoding $E_{3,2}$ and the new message, producing a new ternary memory-state vector, and subsequently the last vector is converted to a 2n-bit vector; and 3) on a third write, an n-bit vector v is written, with $c = ((c_{1,1}, c_{1,2}), \ldots, (c_{n,1}, c_{n,2}))$ being the current memory-state vector, and then, $E_3(v, c) = ((c'_{1,1}, c'_{1,2}), \ldots, (c \propto_{n,1}, c'_{n,2}))$ is a vector, defined as follows: for $1 \leq i \leq n$, $(c'_{i,1}, c'_{i,2}) = (1,1)$ if $v_i = 1$ and otherwise $(c'_{i,1}, c'_{i,2})$.

7. A method for writing data to a non transient medium using WOM-codes to provide more than two writes, the method comprising:

defining, in an electronic encoder, parity-check matrix H of size (n−k)×n, wherein for a vector v of length n over GF(q), let H(v) be the matrix H with zero columns replacing the columns that correspond to the positions of the non-zero values in v, and a set of memory vectors $V_c^{(q)}$ is defined such that $V_c^{(q)} = \{v \in (GF(q))^n | \text{rank}(\mathcal{R}(v)) = n-k\}$ defining, in the encoder, a non binary two-write code according to claim 1, wherein $[n, 2; |V_c^{(q)}|, q^{n-k}]$;

writing data, by the encoder, to the non transient medium more than two times over the alphabet of $V_c^{(q)}$.

8. The method of claim 7, wherein said writing writes the symbol into cells without the erase of the entire memory.

9. A method for writing data to a non transient medium having q levels, where q is a prime number or a power of a prime number greater than 2, using WOM-codes to provide a guaranteed number of multiple writes, the method comprising steps of:

defining, in an electronic encoder, a parity check matrix H for a linear code C[n,k] over GF(q) with a parity-check matrix H of size (n−k)×n to code the data such that the i-th column of $H_v$, $1 \leq i \leq n$, is the i-th column of H if $v_i = 0$ and otherwise it is a zeros column, wherein $\{v_1, v_2, \ldots v_{|Vc|}\}$ is an ordering of a set of memory vectors Vc;

defining, in the encoder, a set Vc of memory vectors Si such that each vector v has a rank as follows:

$V_c^{(q)} = \{v \in (GF(q))^n | \text{rank}(H(v)) = n-k\}$ writing, by the encoder, a symbol to the non transient medium over an alphabet of size |Vc|.

10. The method of claim 9, wherein said writing writes the symbol into cells without the erase of the entire memory.

11. The method of claim 9, wherein the linear code C[n,k] comprises an unrestricted linear code.

* * * * *

UNITED STATES PATENT AND TRADEMARK OFFICE
CERTIFICATE OF CORRECTION

PATENT NO.         : 9,141,474 B2                                       Page 1 of 1
APPLICATION NO.    : 13/702474
DATED              : September 22, 2015
INVENTOR(S)        : Eitan Yaakobi et al.

It is certified that error appears in the above-identified patent and that said Letters Patent is hereby corrected as shown below:

In the Specification:

Col. 2, line 2        Please delete the letter "t" after the word --writes--.

Col. 3, line 2        Please delete "Thoerem" and insert --Theorem-- therefor.

Col. 5, line 52       Please delete "twill" and insert --will-- therefor.

Signed and Sealed this
Thirty-first Day of May, 2016

Michelle K. Lee
*Director of the United States Patent and Trademark Office*